United States Patent [19]
Labram

[11] Patent Number: 6,069,509
[45] Date of Patent: May 30, 2000

[54] OUTPUT STAGE WITH SLEWING CONTROL MEANS

[75] Inventor: Steven M. Labram, Crolles, France

[73] Assignee: U.S. Philips Corporation, New York, N.Y.

[21] Appl. No.: 09/111,612

[22] Filed: Jul. 7, 1998

[30] Foreign Application Priority Data

Jul. 8, 1997 [EP] European Pat. Off. .............. 97401630

[51] Int. Cl.$^7$ ............................... H03K 5/12; H03B 1/00
[52] U.S. Cl. ............................................. 327/170; 134/112
[58] Field of Search ...................... 327/108, 111, 327/112, 134, 310, 313, 379, 380, 381, 383, 389, 170; 326/26, 27

[56] References Cited

U.S. PATENT DOCUMENTS

| | | | |
|---|---|---|---|
| 5,013,940 | 5/1991 | Ansel ....................................... | 307/473 |
| 5,126,588 | 6/1992 | Reichmeyer et al. .................. | 327/108 |
| 5,214,320 | 5/1993 | Truong ...................................... | 326/27 |
| 5,430,335 | 7/1995 | Tanoi ....................................... | 327/170 |
| 5,568,081 | 10/1996 | Lui et al. ................................ | 327/380 |
| 5,598,107 | 1/1997 | Cabuk ....................................... | 326/27 |
| 5,623,221 | 4/1997 | Miyake .................................... | 327/108 |
| 5,877,647 | 3/1999 | Vajapey et al. .......................... | 327/112 |

*Primary Examiner*—Toan Tran
*Attorney, Agent, or Firm*—Brian J. Wieghaus

[57] ABSTRACT

An output stage comprising an input terminal (IP) for receiving an input signal ($V_i$); an output terminal (OP) for delivering an output signal ($V_o$) in response to the input signal ($V_i$); a first (1) and second (2) supply terminal for receiving a supply voltage (SV); a field effect transistor (Q1) comprising a gate (GN), and a main current path between a source and a drain coupled between the first supply terminal (1) and the output terminal (OP); and slewing control means (SCM) for reducing the speed of voltage change at the gate (GN) of the field effect transistor (Q1) for reducing the speed of current change through the main current path of the field effect transistor (Q1) when the output signal ($V_o$) changes from a first steady state (FST) via a transition area (TRE) to a second steady state (SST). The slewing control means (SCM) comprises first means for reducing the gate-source voltage V(GN) between the gate (GN) and the source of the field effect transistor (Q1) in at least part of the transition area (TRE) when the field effect transistor (Q1) changes from a nonconducting state to a conducting state and thus causing the output signal ($V_o$) to be changed from the first steady state (FST), via the transition area (TRE), to the second steady state (SST). The first means avoid the field effect transistor (Q1) to become out of saturation, and thus avoids an abrupt change of the current through the field effect transistor (Q1), thereby avoiding relatively large voltage spikes at the first supply voltage (SV) and/or the output signal ($V_o$).

7 Claims, 4 Drawing Sheets

I

II

III

IV

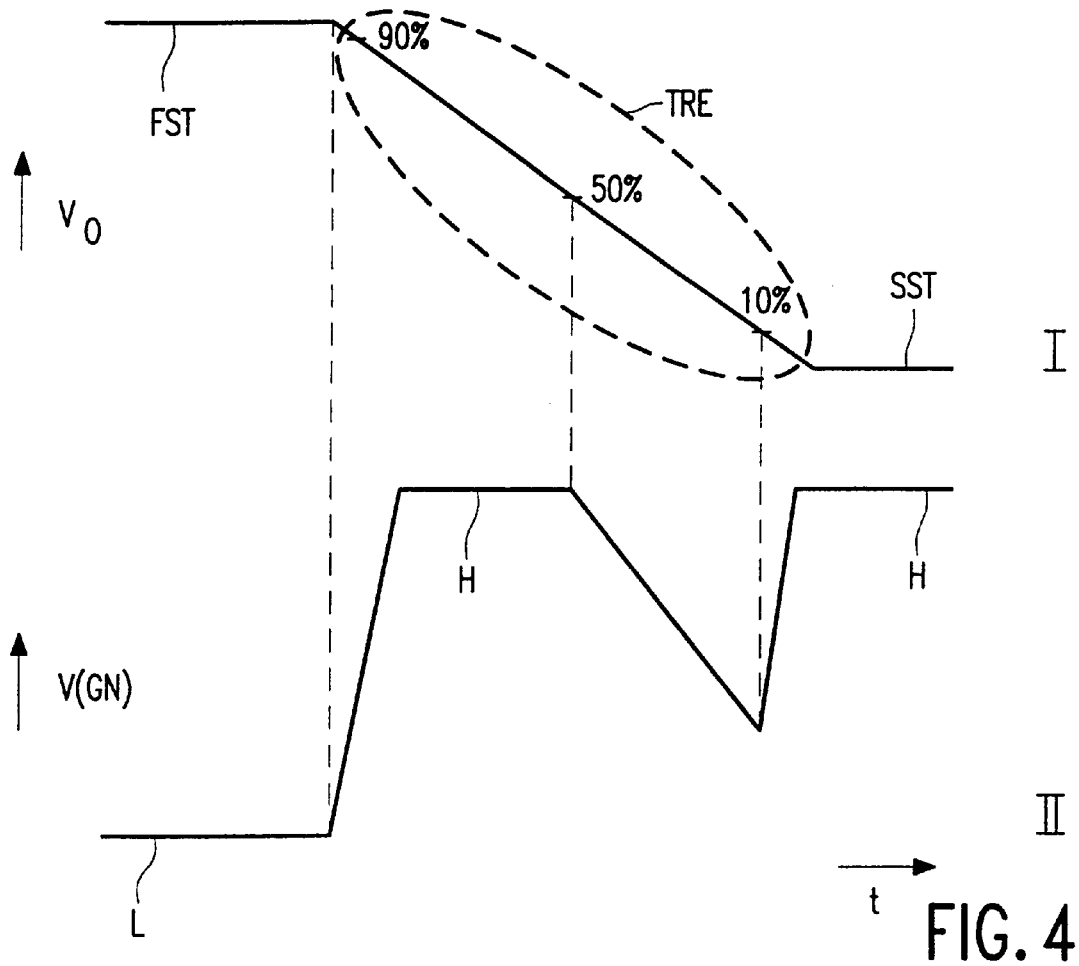
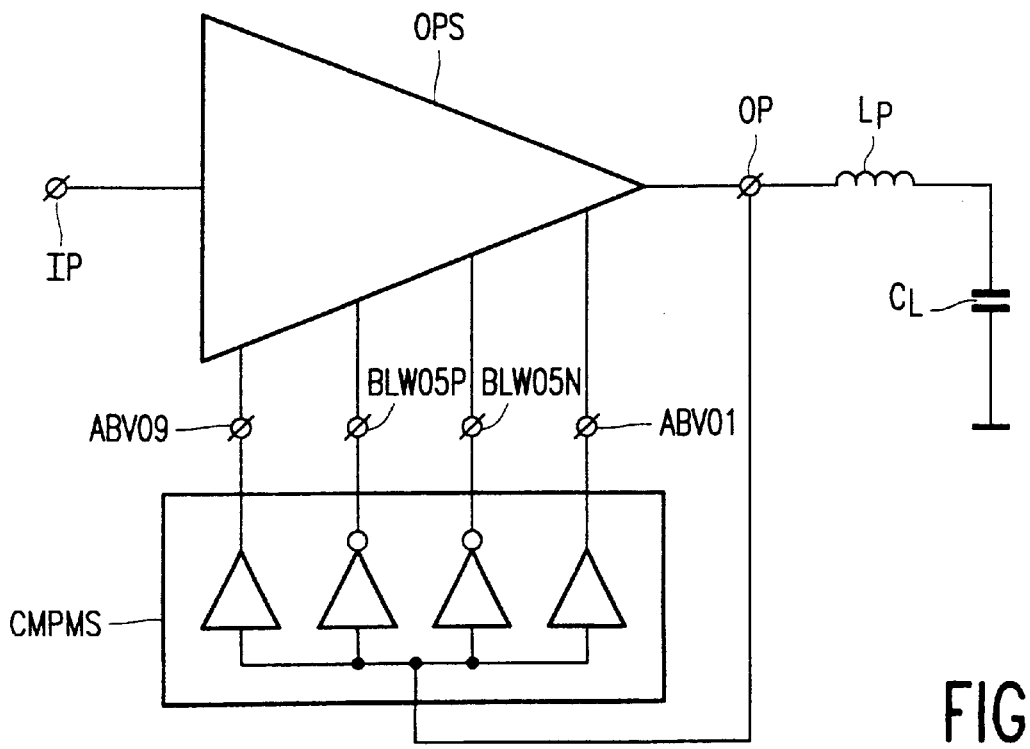
FIG. 4
FIG. 5

OUTPUT STAGE WITH SLEWING CONTROL MEANS

BACKGROUND OF THE INVENTION

The invention relates to an output stage comprising an input terminal for receiving an input signal; an output terminal for delivering an output signal in response to the input signal; a first and a second supply terminal for receiving a supply voltage; a field effect transistor comprising a gate, and a main current path between a source and a drain coupled between the first supply terminal and the output terminal; and slewing control means for reducing the speed of voltage change at the gate of the field effect transistor for reducing the speed of current change through the main current path of the field effect transistor when the output signal changes from a first steady state via a transition area to a second steady state.

Such an output stage is known from U.S. Pat. No. 5,013,940. In this known output stage the slewing control means limit the discharge current from the gate-source capacitance of the field effect transistor when the field effect transistor is turning off because the output signal changes from the second (logic "low") steady state via the transition area to the first (logic "high") steady state. This is done to limit the rate of change of current through the first supply terminal and thus also limit the rate of change of current through the output terminal. The limitation of the rate of change through the first supply terminal and/or the output terminal is needed to reduce parasitic voltage spikes at the first supply terminal and/or at the output terminal caused by parasitic inductances in series with the first input terminal and/or in series with the output terminal.

When in the known output stage the field effect transistor is turning on because the output signal changes from the first (logic "high") steady state via the transition area to the second (logic "low") steady state, the field effect transistor will be switched off quite abruptly somewhere during the transition area because the field effect transistor is no longer in saturation due to a lack of drain-source voltage of the field effect transistor. This has a drawback of causing relatively large voltage spikes at the first supply terminal and/or the output terminal.

SUMMARY OF THE INVENTION

It is an object of the invention to provide an improved output stage which eliminates the above mentioned drawback.

To this end, according to the invention, the output stage of the type defined in the opening paragraph is characterized in that the slewing control means comprises first means for reducing the gate-source voltage of the field effect transistor in at least part of the transition area when the field effect transistor changes from a non-conducting state to a conducting state and thus causes the output signal to be changed from the first steady state, via the transition area, to the second steady state.

The invention is based on the recognition of the fact that the saturation voltage of a field effect transistor decreases with decreasing gate-source voltage.

An embodiment of an output stage according to the invention may be characterized in that the first means comprises a current source coupled between the gate of the field effect transistor and the first supply terminal. The effect of the current source is that the gate-source voltage of the field effect transistor decreases.

Another embodiment of an output stage according to the invention may be characterized in that the current source comprises a control input coupled to digital logic circuitry for receiving a digital control signal for switching on or off the current source. With this it has become possible to switch on the current source, and thus decreasing the gate-source voltage of the field effect transistor, only when it is needed that is to say during some part of the transition area when the output signal changes from the first steady state to the second steady state.

Yet another embodiment of an output stage according to the invention may be characterized in that the value of the digital control signal depends on the value of the output signal. By so doing the current source automatically turns on during some part of the transition area when the output signal changes from the first steady state to the second steady state.

BRIEF DESCRIPTION OF THE DRAWINGS

The invention will be described in more detail with reference to the accompanying drawings in which:

FIG. 4 is a set of diagrams representing the output signal changing from the first steady state via the transition area to the second steady state, and the corresponding gate-source voltage of the field effect transistor of the output stage; and FIG. 5 is a global schematic scheme showing the output stage together with comparator means for generating the control signals from the output terminal of the output stage in accordance with the invention.

In these Figures parts or elements having like functions or purposes bear the same reference symbols.

DESCRIPTION OF THE PREFERRED EMBODIMENTS

Figure 1:
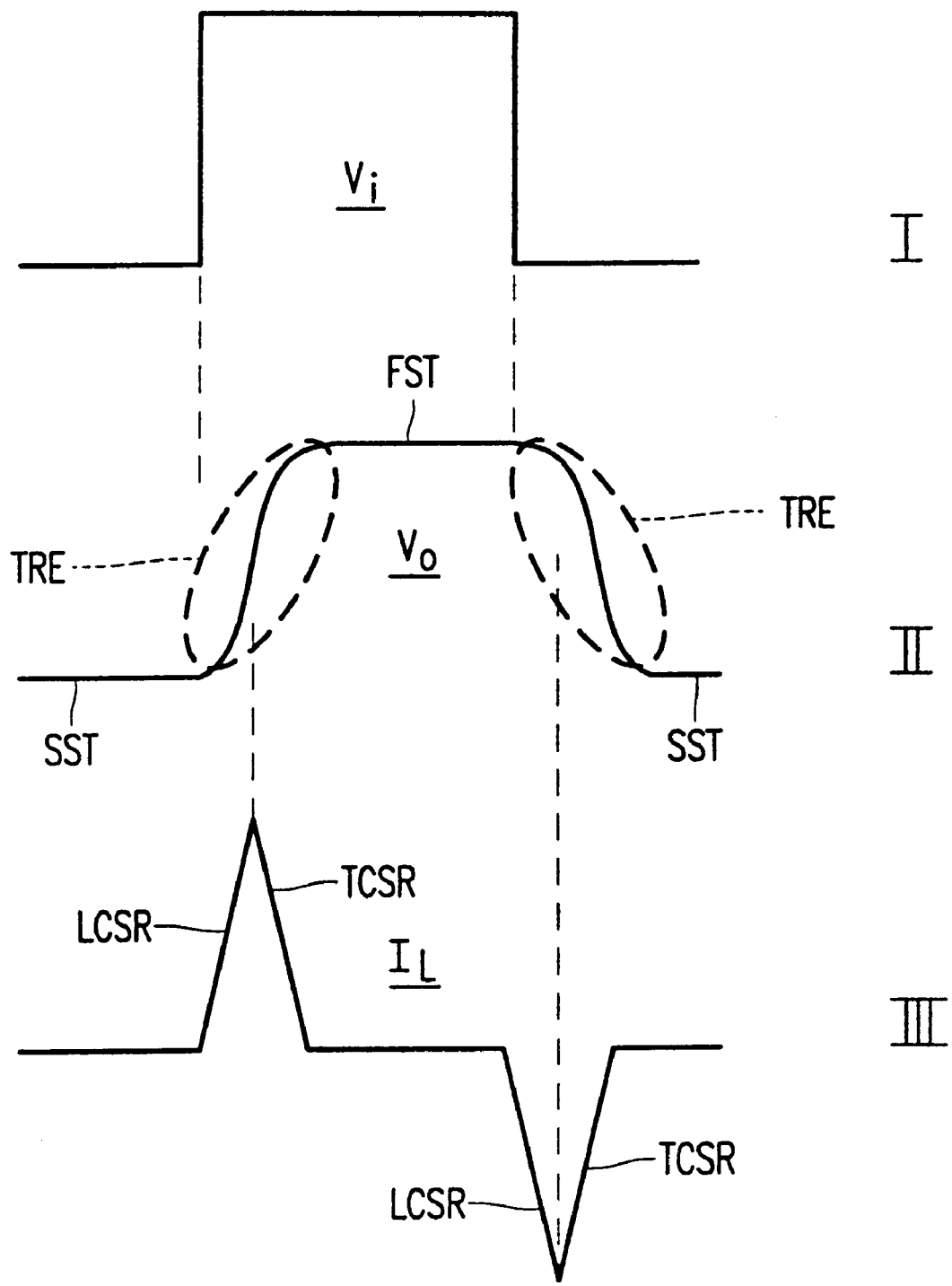
FIG. 1 is a set of diagrams representing the input signal, the output signal, and the current through the output terminal when a capacitive load is connected between the first supply terminal and the output terminal of the output stage.
Figure 2:
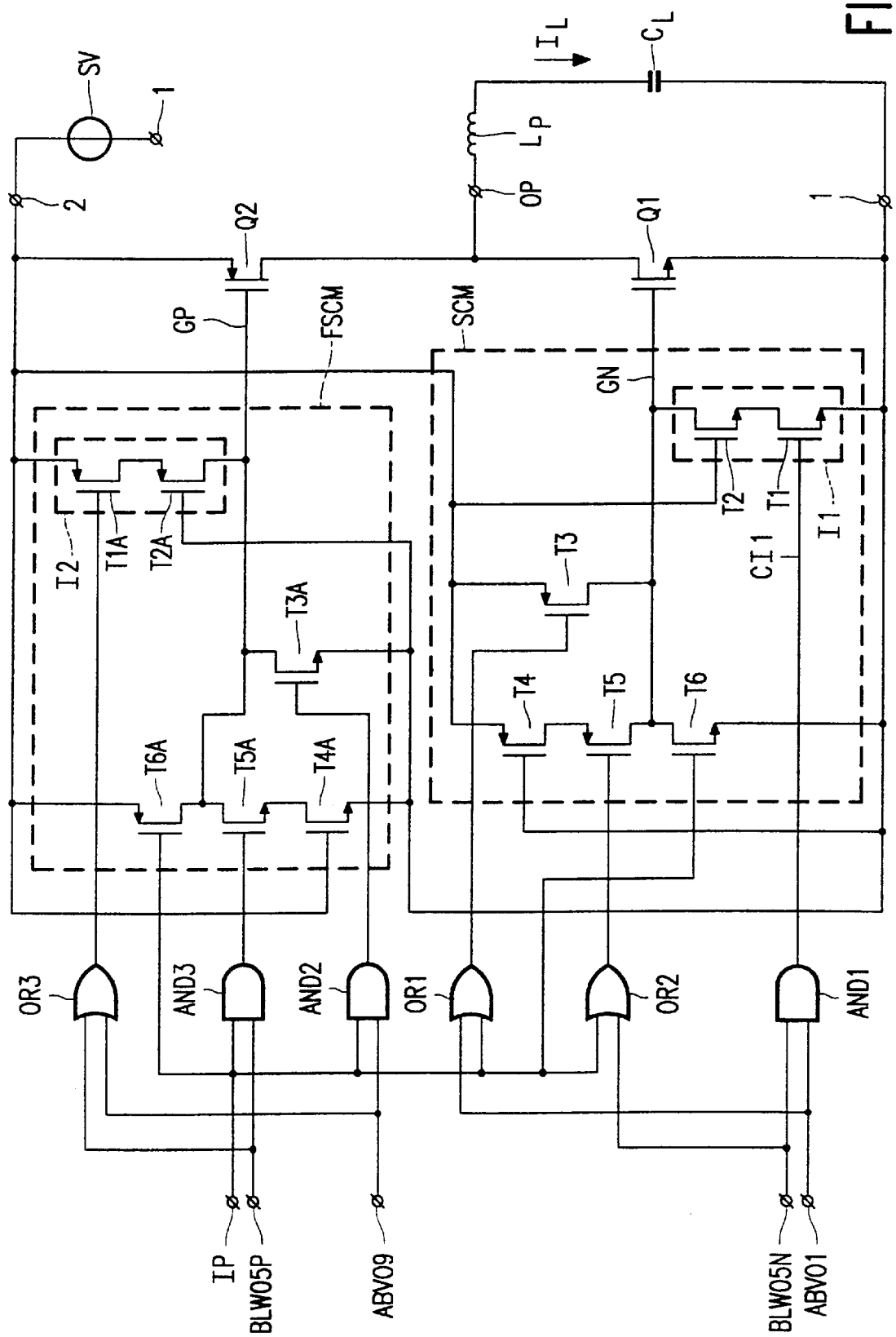
FIG. 2 is a circuit diagram of an output stage in accordance with the invention.

In FIG. 1 diagram I represents an input signal $V_i$ at an input terminal IP of an output stage according to the invention which is shown in FIG. 2. Diagram II shows an output signal $V_o$ at an output terminal OP. The output signal $V_o$ comprises a first steady state FST and a second steady state SST. When the output signal $V_o$ is somewhere in between the first steady state FST and the second steady state SST, it is in the transition area TRE. Diagram III gives a rough indication of a current $I_L$ through the output terminal OP when a load capacitor $C_L$ is coupled between the output terminal OP and a first supply terminal 1 of the output stage. During the transition area TRE the absolute value of the current $I_L$ through the load capacitor $C_L$ first increases and then decreases. The increase of the current $I_L$ is indicated as a leading current slew rate edge LCSR and the decrease of the current $I_L$ is indicated as a trailing current slew rate edge TCSR.

The known output stage as presented in the aforementioned U.S. Pat. No. 5,013,940 only concerns the limiting of the leading current slew rate edge LCSR. The trailing current slew rate edge TCSR is ignored. The trailing current slew rate edge TCSR can not be limited quite so easily because it is caused by a field effect transistor Q1 which has fallen out of saturation. The output stage according to the invention is especially concerned with the limiting of the trailing current slew rate edge TCSR.

FIG. 2 shows a circuit diagram of an output stage in accordance with the invention. A supply voltage SV is coupled between the first supply terminal 1 and a second supply terminal 2. A parasitic inductance $L_p$ is shown in series with the load capacitor $C_L$. The parasitic inductance $L_p$ will cause relatively large voltage spikes at the output terminal OP if the leading current slew rate edge LCSR or the trailing current slew rate edge TCSR have not been limited sufficiently. Like the parasitic inductance $L_p$ in series with the output terminal OP also other parasitic inductances in series with the first supply terminal 1 or the second supply terminal 2 can cause relatively large voltage spikes at the first supply terminal 1 and the second supply terminal 2, respectively. By way of example the invention only describes the reduction of the voltage spikes at the output terminal OP due by the parasitic inductance $L_p$, but the invention also reduces the voltage spikes at the first and the second supply terminals 1,2 in a similar way.

The field effect transistor Q1 comprises a gate GN, a source coupled with the first supply terminal 1, and a drain coupled with the output terminal OP. The gate-source voltage V(GN) (see also FIG. 4) of the field effect transistor Q1 is controlled by slewing control means SCM. The slewing control means SCM comprises: first means implemented as a current source I1 comprising a first transistor T1 with a control input CI1 and a main current path and a second transistor T2 with an input electrode coupled to the second supply terminal 2 and a main current path, the main current paths of the first and the second transistors T1,T2 being coupled in series between the gate GN of the field effect transistor Q1 and the first supply terminal 1; second means implemented as a third transistor T3 with an input electrode and a main current path coupled between the second supply terminal 2 and the gate GN of the field effect transistor Q1; a fourth transistor T4 with an input electrode coupled to the first supply terminal 1 and a main current path; a fifth transistor T5 with an input electrode and a main current path, the main current paths of the fourth and the fifth transistors T4,T5 being coupled in series between the second supply terminal 2 and the gate GN; and a sixth transistor T6 with an input electrode coupled to the input terminal IP and a main current path coupled between the gate GN and the first supply terminal 1.

The output stage further comprises: a further field effect transistor Q2 comprising a gate GP, a source coupled with the second supply terminal 2, and a drain coupled with the output terminal OP; further slewing control means FSCM; digital logic circuitry; and a first control terminal ABV01, a second control terminal BLW05N, a third control terminal ABV09, and a fourth control terminal BLW05P.

The further stewing control means FSCM comprises: third means implemented as a current source I2 comprising a seventh transistor T1A with an input electrode and a main current path and a eighth transistor T2A with an input electrode and a main current path, the main current paths of the seventh and the eighth transistors T1A,T2A being coupled in series between the gate GP of the further field effect transistor Q2 and the second supply terminal 2; fourth means implemented as a ninth transistor T3A with an input electrode and a main current path coupled between the first supply terminal 1 and the gate GP of the further field effect transistor Q2; a tenth transistor T4A with an input electrode coupled to the second supply terminal 2 and a main current path; an eleventh transistor T5A with an input electrode and a main current path, the main current paths of the tenth and the eleventh transistors T4A,T5A being coupled in series between the first supply terminal 1 and the gate GP; and a twelfth transistor T6A with an input electrode coupled to the input terminal IP and a main current path coupled between the gate GP and the second supply terminal 2.

The digital logic circuitry comprises: a first logic and-gate AND1 with a first input coupled to the first control terminal ABV01, a second input coupled to the second control terminal BLW05N, and an output coupled to the control input CI1; a second logic and-gate AND2 with a first input coupled to the input terminal IP, a second input coupled to the third control terminal ABV09, and an output coupled to the input electrode of the ninth transistor T3A; a third logic and-gate AND3 with a first input coupled to the input terminal IP, a second input coupled to the fourth control terminal BLW05P, and an output coupled to the input electrode of the eleventh transistor T5A; a first logic or-gate OR1 with a first input coupled to the input terminal IP, a second input coupled to the first control terminal ABV01, and an output coupled to the input electrode of the third transistor T3; a second logic or-gate OR2 with a first input coupled to the input terminal IP, a second input coupled to the second control terminal BLW05N, and an output coupled to the input electrode of the fifth transistor T5; and a third logic or-gate OR3 with a first input coupled to the third control terminal ABV09, a second input coupled to the fourth control terminal BLW05P, and an output coupled to the input electrode of the seventh transistor T1A.

The operation of the field effect transistor Q1 and the further field effect transistor Q2 are complementary that is to say that when the output signal $V_o$ at the output terminal OP changes from the first steady state FST to the second steady state SST the field effect transistor Q1 will be conducting whereas the further field effect transistor Q2 will be non-conducting. The reverse will happen when the output signal $V_o$ at the output terminal OP changes from the second steady state SST to the first state FST. The elements of the following pairs have a mutual similar operation: Q1;Q2, I1;I2, SCM;FSCM, T1;T1A, T2;T2A, T3;T3A, T4;T4A, T5;T5A, T6;T6A, AND1;OR3, OR1;AND2, OR2;AND3; ABV01;ABV09, BLW05N;BLW05P. Because of the similar operation only the operation of the field effect transistor Q1 and the other first elements of the above mentioned pairs will be explained.

Figure 3:
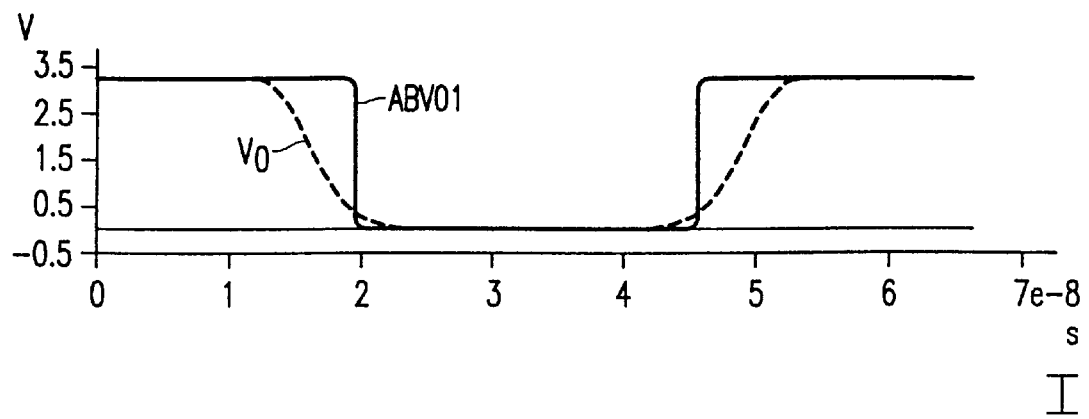
FIG. 3 is a set of diagrams of control signals of the output stage.
Figure 3:
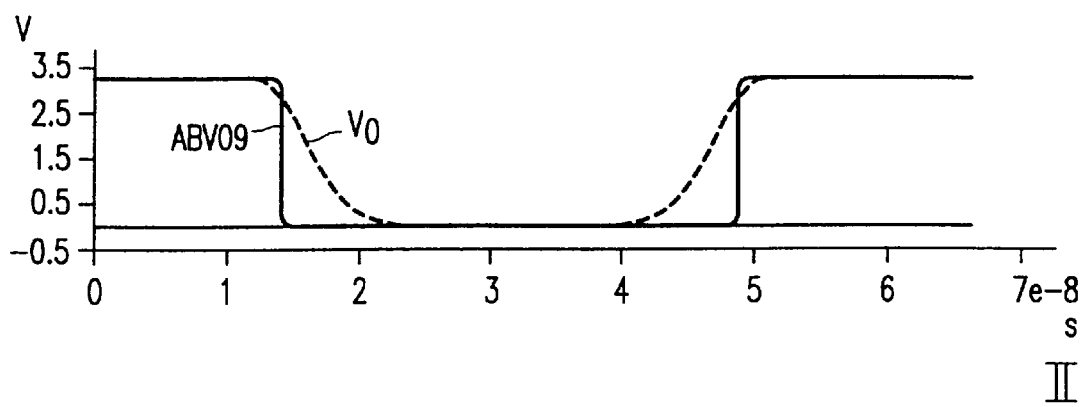
Figure 3:
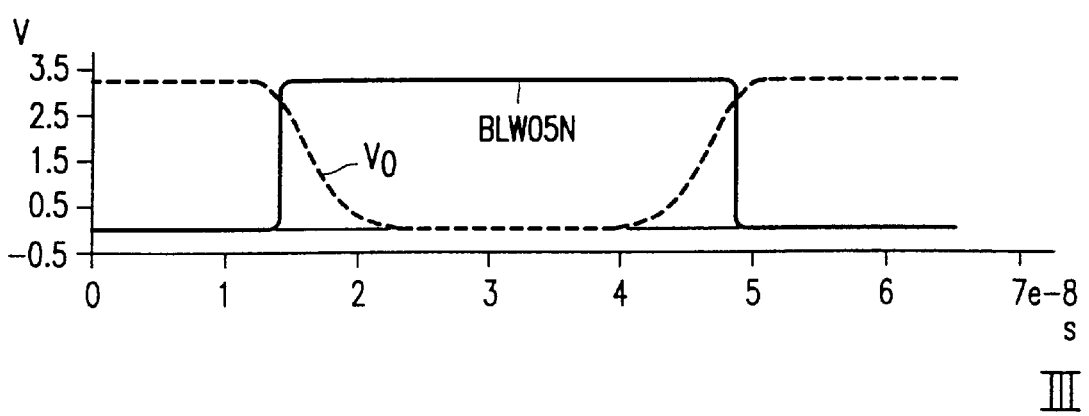
Figure 3:
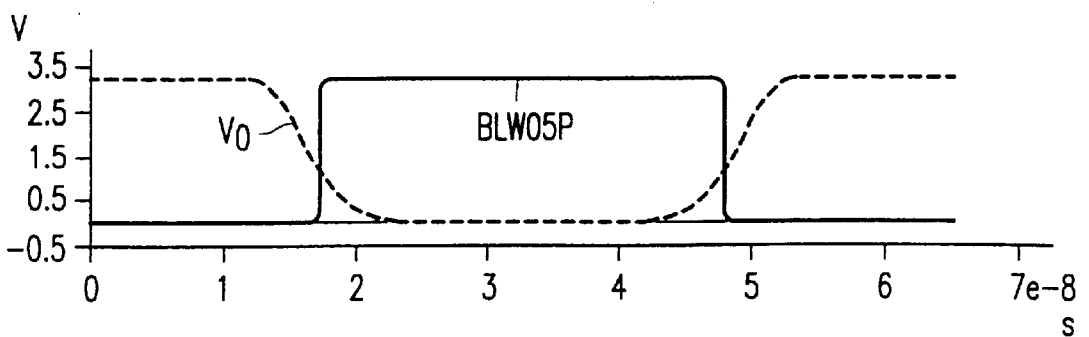

In FIG. 3 the voltages at the first control terminal ABV01, the third control terminal ABV09, the second control terminal BLW05N, and the fourth control terminal BLW05P are shown in diagrams I,II,III, and IV respectively. The voltages at the above mentioned control terminals depend on the value of the output signal $V_o$ and/or the supply voltage SV, as will be explained later. Also the output signal $V_o$ is shown in each of the diagrams I,II,III and IV. As shown in the diagrams of FIG. 3 the voltage at the first control terminal ABV01 is logic "high" when the output voltage $V_o$ is above 10% of the supply voltage SV, the voltage at the third control terminal ABV09 is logic "high" when the output voltage $V_o$ is above 90% of the supply voltage SV, and the voltage at the second control terminal BLW05N is logic "high" when the output voltage $V_o$ is below 50% of the supply voltage SV. The fourth control terminal BLW05P is similar in operation to that of the third control terminal ABV09.

The operation of the output stage is as follows.

To begin with assume that the output signal $V_o$ is in the first steady state FST (logic "high") that is to say that the input signal $V_i$ at the input terminal IP and the voltages at the first control terminal ABV01 and at the third control terminal ABV09 are logic "high". The voltage at the second control terminal BLW05N is logic "low". The voltages at the outputs of the first and the second logic or-gates OR1,OR2 are logic "high" causing the third and the fifth transistors T3,T5 to be non-conducting. The voltage at the output of the first logic and-gate AND1 is logic "low" causing the current source I1 to be switched off. The sixth transistor T6 is conducting since its input electrode is connected to the input terminal IP. As a consequence the voltage at the gate GN is logic "low" keeping the field effect transistor Q1 non-conducting and thereby keeping the output signal $V_o$ at the output terminal OP in the first steady state FST.

Next assume that the input signal $V_i$ changes from logic "high" to logic "low". Initially the output signal $V_o$ will still be in the first steady state FST and therefore the voltages at the first control terminal ABV01 and at the third control terminal ABV09 are still logic "high" and the voltage at the second control terminal BLW05N is still logic "low". As a consequence the current source I1 remains switched off and the third transistor T3 remains non-conducting. Because the input signal $V_i$ at the input terminal IP has changed from logic "high" to logic "low" and the voltage at the second control input BLW05N is still logic "low" the voltage at the output of the second logic or-gate OR2 changes from logic "high" to logic "low" and therefore the fifth transistor T5 will be conducting. The sixth transistor T6 is non-conducting since its input electrode is connected to the input terminal IP. Because both the fourth and the fifth transistors T4,T5 are conducting the gate-source capacitance (not shown in FIG. 2) of the gate GN will be charged causing the voltage at the gate GN to be increased. The fourth transistor T4 operates as a current limiter. Therefore the voltage at the gate GN will not increase too rapidly, thus avoiding the output signal $V_o$ to be changed too rapidly.

In FIG. 4 diagram I shows an asymptotic approximation of the output signal $V_o$ changing from the first steady state FST via the transition area TRE to the second steady state SST. Diagram II shows an asymptotic approximation of the corresponding gate-source voltage V(GN) of the field effect transistor Q1. As shown in FIG. 4 the gate-source voltage V(GN) increases from logic "low" (indicated with the letter L) to logic "high" (indicated with the letter H) thereby causing the output signal $V_o$ to be changed from the first steady state FST into the transition area TRE. The gate-source voltage V(GN) remains logic "high" until the output signal $V_o$ has fallen below 50% of the supply voltage SV. When the output signal $V_o$ has fallen below 50% of the supply voltage SV the voltage at the second control terminal BLW05N will change from logic "low" to logic "high". As a consequence the voltage at the output of the second logic or-gate OR2 changes from logic "low" to logic "high" causing the fifth transistor T5 to be non-conducting, and the voltage at the output of the first logic and-gate AND1 changes from logic "low" to logic "high" causing the current source I1 to be switched on. In consequence of this the gate-source capacitance of the field effect transistor Q1 will be discharged causing the gate-source voltage V(GN) to decrease, as shown in diagram II of FIG. 4. Because the second transistor T2 operates as a current limiter, the decrease of the gate-source voltage V(GN) will not be too rapid and therefore the field effect transistor Q1 will still be conducting though the current through the main current path of the field effect transistor Q1 decreases. Because the field effect transistor Q1 is still conducting the output signal $V_o$ continues to decrease. As shown in FIG. 4 both the output signal $V_o$ and the gate-source voltage V(GN) are decreasing.

Despite the continuing decrease of the output signal $V_o$ the field effect transistor Q1 remains in saturation because the minimum needed voltage between the drain and the source of the field effect transistor Q1 also decreases as a result of the decrease of the gate-source voltage V(GN). By this the field effect transistor Q1 doesn't turn off suddenly and thus an abrupt change of the current $I_L$ through the output terminal OP is avoided.

When the output signal $V_o$ has fallen below 10% of the supply voltage SV the voltage at the first control terminal ABV01 will change from logic "high" to "logic" low and thereby changing the voltage at the output of the first logic and-gate AND1 from logic "high" to logic "low". As a consequence the current source I1 will be switched off. Since both the input signal $V_i$ at the input terminal IP and the voltage at the first control terminal ABV01 are logic "low" the voltage at the output of the first logic or-gate OR1 will change from logic "high" to logic "low" and thereby causing the third transistor T3 to be conducting. As a consequence the gate-source voltage V(GN) will increase again as shown in diagram II of FIG. 4. The field effect transistor Q1 will no longer be in saturation. This however will not result in large voltage spikes at the first supply voltage SV and/or the output signal $V_o$ because the current $I_L$ through the output terminal OP is already quite small. A purpose for increasing the gate-source voltage V(GN) again when the output signal $V_o$ has fallen below 10% of the supply voltage SV is that the field effect transistor Q1 is then capable of conducting quite a large DC-current through its main current path and thereby keeping the output signal $V_o$ in the second steady state SST. This is important when for instance a resistive load is connected between the second supply terminal 2 and the output terminal OP.

FIG. 5 shows a global schematic scheme showing the output stage OPS together with comparator means CMPMS for generating the first, second, third and fourth control signals ABV01,BLW05N,ABV09,BLW05P from the output terminal OP of the output stage OPS. The comparator means CMPMS have at least one input, coupled with the output terminal OP, and four outputs. Each of the four outputs is coupled to one of the first, second, third or fourth control terminals ABV01,BLW05N,ABV09,BLW05P. A purpose of the comparator means CMPMS is to generate the needed four control signals as shown in FIG. 3 for the above mentioned four control terminals. The comparator means CMPMS can for instance comprise buffers and/or inverters whereby the logic "low" and logic "high" values of the inputs of the above mentioned buffers and/or inverters are properly determined by proper dimensioning of the input transistors of the buffers and/or inverters.

The transistors T1-T6 and T1-T6A may also be implemented with bipolar transistors instead of the field effect transistors shown in FIG. 2. Also combinations of bipolar transistors and field effect transistors are possible. Even a transistor with an opposite type of conduction might be used. For instance the P-type field effect transistor T3 can be replaced with an N-type bipolar transistor with the collector connected to the second supply terminal 2 and the emitter coupled to the gate GN. The voltage at the output of the first logic or-gate OR1 must then be inverted and coupled to the base of the above mentioned N-type bipolar transistor. Also the logic gates of the digital circuitry may be implemented differently. In stead of the capacitive load $C_L$ coupled between the output terminal OP and the first supply terminal 1 any kind of load may be coupled between the output terminal OP and the first supply terminal 1 and/or between the output terminal OP and the second supply terminal 2.

The mentioned 10%, 50%, and 90% percentage levels of the output signal $V_o$ are chosen by way of example and can be replaced by other percentage levels. The output stage can be constructed as an integrated circuit or also by means of discrete components.

What is claimed is:

1. An output stage comprising an input terminal (IP) for receiving an input signal ($V_i$); an output terminal (OP) for delivering an output signal ($V_o$) in response to the input signal ($V_i$); a first (1) and a second (2) supply terminal for receiving a supply voltage (SV); a field effect transistor (Q1) comprising a gate (GN), and a main current path between a source and a drain coupled between the first supply terminal (1) and the output terminal (OP); and slewing control means (SCM) for reducing the speed of voltage change at the gate (GN) of the field effect transistor (Q1) for reducing the speed of current change through the main current path of the field effect transistor (Q1) when the output signal ($V_o$) changes from a first steady state (FST) via a transition area (TRE) to a second steady state (SST), characterized in that the slewing control means (SCM) comprises first means for reducing the gate-source voltage V(GN) of the field effect transistor (Q1) in at least part of the transition area (TRE) when the field effect transistor (Q1) changes from a non-conducting state to a conducting state and thus causes the output signal ($V_o$) to be changed from the first steady state (FST), via the transition area (TRE), to the second steady state (SST).

2. An output stage as claimed in claim 1, characterized in that the first means comprises a current source (I1) coupled between the gate (GN) of the field effect transistor (Q1) and the first supply terminal (1).

3. An output stage as claimed in claim 2, characterized in that the current source (I1) comprises a control input (CI1) coupled to digital logic circuitry for receiving a digital control signal for switching on or off the current source (I1).

4. An output stage as claimed in claim 3, characterized in that the value of the digital control signal depends on the value of the output signal ($V_o$).

5. An output stage as claimed in claim 3, characterized in that the current source (I1) comprises a first transistor (T1) with a main current path and a second transistor (T2) with a main current path, and in that the main current paths of the first (T1) and the second (T2) transistors are coupled in series between the gate (GN) of the field effect transistor (Q1) and the first supply terminal (1).

6. An output stage as claimed in claim 1, characterized in that it comprises second means for increasing the gate-source voltage V(GN) between the gate (GN) and the source of the field effect transistor (Q1) when the output signal ($V_o$) is in the second steady state (SST).

7. An output stage as claimed in claim 6, characterized in that the second means comprises a third transistor (T3) comprising a main current path coupled between the second supply terminal (2) and the gate (GN) of the field effect transistor (Q1) and a gate coupled to digital logic circuitry for receiving a digital control signal for switching the main current path.

* * * * *